United States Patent [19]
Kapoor

[11] Patent Number: 5,614,428
[45] Date of Patent: Mar. 25, 1997

[54] PROCESS AND STRUCTURE FOR REDUCTION OF CHANNELING DURING IMPLANTATION OF SOURCE AND DRAIN REGIONS IN FORMATION OF MOS INTEGRATED CIRCUIT STRUCTURES

[75] Inventor: Ashok K. Kapoor, Palo Alto, Calif.

[73] Assignee: LSI Logic Corporation, Milpitas, Calif.

[21] Appl. No.: 546,921

[22] Filed: Oct. 23, 1995

[51] Int. Cl.⁶ .................................................. H01L 21/265
[52] U.S. Cl. .............................. 437/41; 437/193; 437/247
[58] Field of Search ................................ 437/41 GS, 160, 437/193, 247

[56] References Cited

U.S. PATENT DOCUMENTS

| | | | |
|---|---|---|---|
| 4,897,368 | 1/1990 | Kobushi et al. | 437/41 GS |
| 5,278,096 | 1/1994 | Lee et al. | 437/193 |
| 5,364,803 | 11/1994 | Lur et al. | 437/193 |
| 5,464,792 | 11/1995 | Tseng et al. | 437/160 |

*Primary Examiner*—John Niebling
*Assistant Examiner*—Michael S. Lebentritt
*Attorney, Agent, or Firm*—John P. Taylor

[57] ABSTRACT

A process and structure are disclosed for inhibiting the channeling of dopant through the polysilicon gate electrode into a semiconductor substrate during implantation of source and drain regions in the substrate during the formation of MOS devices. After deposition over a semiconductor substrate of a polysilicon layer which will be subsequently patterned to form a gate electrode, an amorphous layer of silicon is formed over the polysilicon layer. This amorphous silicon layer is then treated with a material such as a nitrogen-bearing material capable of inhibiting grain growth and recrystallization of the amorphous silicon during subsequent high temperature processing. The amorphous silicon and polysilicon layers are subsequently conventionally patterned to form the gate electrode. The structure is then implanted without channeling of the dopant ions through the gate electrode into the underlying portion of the substrate where the channel of the MOS device will be formed. The presence of the amorphous silicon over the polysilicon gate electrode inhibits the channeling of the implanted ions through the polysilicon layer, due to the amorphous (non-crystalline) structure of the amorphous silicon, while the treatment of the amorphous silicon with the material capable of inhibiting grain growth in the amorphous silicon prevents or inhibits the recrystallization of the amorphous silicon during subsequent processing before or during the implantation step to form the source and drain regions.

13 Claims, 2 Drawing Sheets

5,614,428

PROCESS AND STRUCTURE FOR REDUCTION OF CHANNELING DURING IMPLANTATION OF SOURCE AND DRAIN REGIONS IN FORMATION OF MOS INTEGRATED CIRCUIT STRUCTURES

BACKGROUND OF THE INVENTION

1. Field of the Invention

This invention relates to integrated circuit structures. More particularly, this invention relates to process and structure for the reduction of channeling during the implantation of source and drain regions during the formation of MOS integrated circuit structures on a semiconductor substrate.

2. Description of the Related Art

In the formation of MOS devices in integrated circuit structures on a semiconductor substrate, a gate oxide layer and a polysilicon layer are formed over a semiconductor substrate, such as a single crystal silicon substrate, and the polysilicon layer is patterned to form the polysilicon gate electrode of the MOS structure, with the gate oxide beneath the polysilicon separating the polysilicon gate electrode from the underlying channel region in the semiconductor substrate.

During the patterning of the polysilicon layer to form the gate electrode, portions of the underlying substrate adjacent the gate electrode are exposed where source and drain regions will be formed in the substrate adjacent the aforementioned channel region. After this patterning step, the entire structure is implanted with a dopant, e.g., boron, phosphorus, or arsenic, depending upon whether P type or N type doping is desired, to form the source and drain regions in the exposed substrate portions. During this implanting step, channeling of the dopant ions through the polysilicon gate electrode into the underlying channel region of the substrate may occur.

After deposition of the polysilicon layer, and doping it to form highly conductive polysilicon, an anneal cycle is carried out during which the grain size of the polysilicon increases, thus making it easier for some of the subsequently implanted dopant ions to channel through the polysilicon gate electrode into the underlying channel region in the substrate. Such implantation of the channel region is undesirable, for example, because it results in an erratic threshold voltage in the resultant MOS device. This poses severe limitations on the fabrication of MOS transistors.

In the past, this problem of channeling through the polysilicon gate electrode was solved by limiting the energy of the ion implantation of the subsequently implanted source/drain dopant so that the implanted dopant did not penetrate through the polysilicon gate electrode to the underlying channel region of the substrate.

When the thickness of the polysilicon gate electrode ranged from about 0.35 to 0.4 micrometers ($\mu$m), i.e., 3500–4000 Angstroms, such a limiting of the source/drain dopant implantation energy was sufficient to remedy the problem. However, as the lateral device and line dimensions shrink in an integrated circuit structure, i.e. shrinkage of line width, so should the thicknesses of the lines and devices. However, attempts to shrink the thickness of the polysilicon gate electrode from the aforementioned 0.35–0.4 $\mu$m thickness down to about 0.2 $\mu$m results in undesirable implantation of the underlying channel region of the MOS device (even when the ion implantation energy is limited) through channeling of the dopant through the polysilicon gate electrode, because of such thinning of the polysilicon gate electrode thickness.

It would, therefore, be highly desirable to provide a process and structure which would inhibit channeling, through the polysilicon gate electrode, of dopant used to form the implanted source and drain regions of a semiconductor substrate, while still permitting the use of polysilicon gate electrodes having a thickness of less than 0.35 $\mu$m, i.e., down to as thin as about 0.2 $\mu$m.

SUMMARY OF THE INVENTION

The invention comprises a process and structure for inhibiting the channeling of dopant through the polysilicon gate electrode into a semiconductor substrate during implantation of source and drain regions in the substrate during the formation of MOS devices. In accordance with the invention, after deposition over a semiconductor substrate of a polysilicon layer which will be subsequently patterned to form a gate electrode, an amorphous layer of silicon is formed over the polysilicon layer. This amorphous silicon layer is then treated, at processing temperatures ranging from about 500° C. to about 700° C., with a material such as a nitrogen-bearing material to inhibit grain growth and recrystallization of the amorphous silicon during subsequent conventional high temperature MOS processing, i.e., processing at temperatures as high as 750° C. (including doping and annealing of the polysilicon), prior to implantation of the structure to form the source/drain regions. The amorphous silicon and polysilicon layers are then conventionally patterned to form the gate electrode. Finally the structure is implanted to form the source/drain regions in the substrate. The presence of the amorphous silicon over the polysilicon gate electrode inhibits the channeling of the implanted ions through the amorphous silicon, due to its amorphous (noncrystalline) structure, while the treatment of the amorphous silicon with the material capable of inhibiting grain growth in the amorphous silicon layer prevents or inhibits the recrystallization of the amorphous silicon during subsequent processing before or during the implantation step to form the source/drain regions.

DETAILED DESCRIPTION OF THE INVENTION

Figure 1:
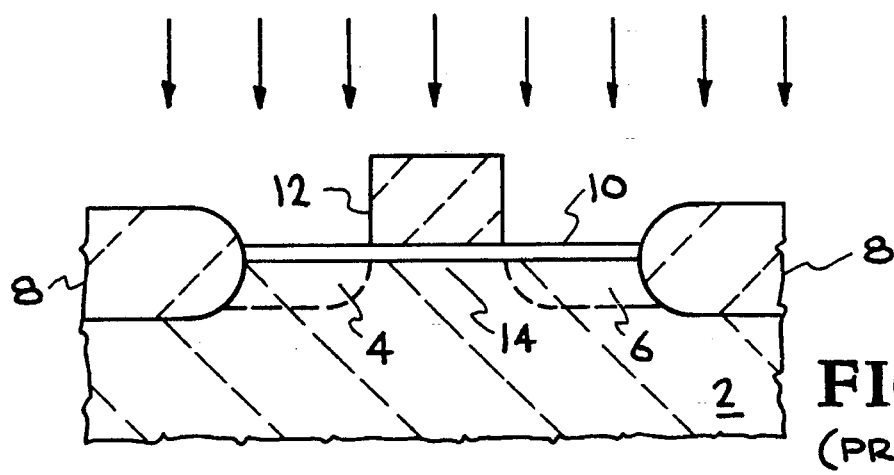
FIG. 1 is a fragmentary vertical cross-sectional view showing the formation of a conventional (prior art) MOS structure during implantation to form the source and drain regions, with only conventional polysilicon used for the gate electrode.

FIG. 1 shows a typical prior art implantation of a semiconductor substrate 2 to form source and drain regions 4 and 6 in a region of substrate 2 bounded by previously formed field oxide 8. A thin oxide layer 10 (a portion of which will eventually form the gate oxide) is formed over the exposed portion of substrate 2 and a polysilicon gate electrode 12 is formed over oxide layer 10 by depositing and then patterning a polysilicon layer. When the substrate is implanted with a P type or N type dopant, as shown by the arrows, to form the desired P type or N type source region 4 and drain region 6, the implanted dopant must be prevented from reaching the portion 14 of substrate 2 beneath polysilicon gate electrode 12 where the channel of the MOS device will be formed. In the prior art, polysilicon gate electrode 12 provided the sole shield against such undesired implantation. If the polysilicon was not sufficiently thick, and/or the implantation energy was not sufficiently low, the atoms being implanted into the substrate to form source/drain regions 4 and 6 would also pass into region 14 through channels in polysilicon gate electrode 12. Such undesirable channeling and implantation into the channel portion of the substrate is what this invention seeks to prevent.

Figure 2:
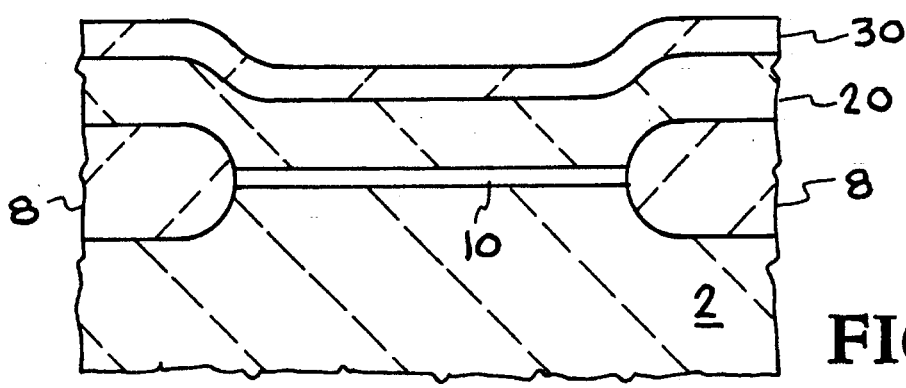
FIG. 2 is a fragmentary vertical cross-sectional view showing an amorphous silicon layer formed over a polysilicon layer, in accordance with the invention.

Turning now to FIG. 2, a substrate 2 is shown having field oxide portions 8 previously formed thereon with a thin oxide layer 10 formed over exposed portions of substrate 2 not covered by field oxide portions 8, as in prior art FIG. 1. A layer 20 of polysilicon is then formed over the structure, in preparation for the formation of a polysilicon gate electrode by the patterning of polysilicon layer 20.

However, unlike the prior art, a layer of amorphous silicon 30 is formed over polysilicon layer 20 prior to the patterning of polysilicon layer 20. This amorphous layer of silicon will be used to prevent dopant from channeling through the underlying polysilicon, as will be explained in more detail below. If the polysilicon layer is to be doped (to increase its conductivity) by a furnace doping, such as with $POCl_3$, such doping, and accompanying anneal, are carried out prior to formation of the amorphous silicon layer over the polysilicon layer. Otherwise, if the polysilicon layer is to be doped by implantation, e.g., with phosphorus, this implantation may be carried out after formation and treatment of the amorphous silicon layer.

Amorphous silicon layer 30 is deposited over polysilicon layer 20 by any convenient form of deposition which will preserve the amorphous state of the deposited silicon material. Conveniently, amorphous silicon layer 30 may be deposited by a chemical vapor deposition (CVD) process carried out at a temperature sufficiently low so that polycrystalline silicon (polysilicon) does not form. Typically, a deposition temperature not exceeding about 550° C., and preferably not exceeding about 500° C., will ensure that the silicon being deposited to form silicon layer 30 is in an amorphous state.

The thickness of amorphous silicon layer 30 should be at least about 0.05 μm (~500 Angstroms), preferably at least about 0.08μm, and most preferably at least about 0.1 μm to ensure that the amorphous layer is thick enough to provide the desired protection against channeling of the subsequent implanted dopant. Thicker layers of amorphous silicon may, of course be used, but are not needed and may actually not be desirable, if total thickness is a design factor in the structure.

Since the lack of any crystalline structure (any orderly crystal structure) in amorphous silicon layer 30 is the key to the inhibition of channeling of the implanted dopant therethrough, it is very important that the amorphous state of the deposited silicon be preserved, not only through the formation (deposition) of the amorphous silicon layer, but also at least until the last implantation step, which is, most typically, the step of implanting the substrate to form the source/drain regions therein in a typical CMOS process. To inhibit grain growth or crystallization of deposited amorphous silicon layer 30, in accordance with the invention, amorphous silicon layer 30 is treated to inhibit grain growth and crystal formation.

This treatment to inhibit grain growth or crystallinity in amorphous silicon layer 30 may comprise any steps and/or materials which will prevent or inhibit such grain growth or crystal formation. In a preferred embodiment, this treatment will comprise contacting the surface of the deposited amorphous silicon layer with a nitrogen-containing material, and most preferably the source of nitrogen in the material consists of ammonia, since ammonia dissociates faster than other nitrogen-bearing materials, such as $N_2$. However, other nitrogen-containing materials such as nitrogen gas ($N_2$), ammonium hydroxide ($NH_4OH$), hydrazine ($N_2H_4$), or hydrazine hydrate ($N_2H_2(OH_2)$) may also be used to treat amorphous silicon layer 30. Alternatively, the nitrogen could also be introduced into the amorphous silicon by implantation of nitrogen ions therein.

The treatment may be carried out by contacting the surface of amorphous silicon layer 30 with the nitrogen-containing material in the form of a gas or vapor, preferably in a closed vessel (to prevent contact of the silicon surface with other materials such as oxygen which might inhibit migration of the nitrogen atoms into the amorphous silicon). Preferably, this contact of the amorphous silicon surface is carried out immediately after formation of amorphous layer 30, i.e., before other materials such as oxygen have had an opportunity to react with the silicon. Such a treatment is carried out for a period ranging from a few seconds to as much as several hours at a temperature which may range from about room temperature to as high a temperature as is possible while preserving the amorphous state of silicon layer 30. Typically, such a treatment will be carried out for a few minutes at a temperature of from about 500° C. to about 600° C. at atmospheric pressure or higher.

Figure 3:
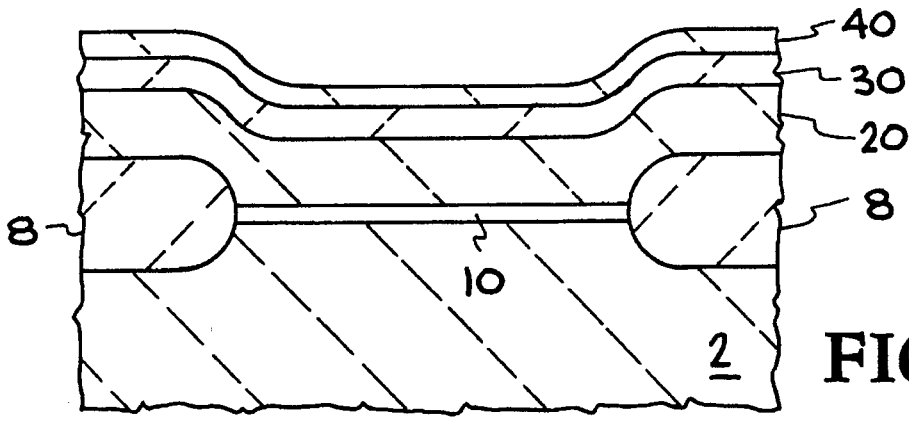
FIG. 3 is a fragmentary vertical cross-sectional view showing the treatment of the surface of the amorphous silicon layer with a large grain growth inhibiting material, such as a nitrogen-containing material, to inhibit large grain growth during subsequent processing of the structure at an elevated temperature, in accordance with the invention.

The treatment of the amorphous silicon with the nitrogen-containing material should extend for a period of time sufficient to incorporate into the amorphous silicon from about 2 wt. % to about 10 wt. % nitrogen into the amorphous silicon, and preferably from about 4 wt. % to about 5 wt. % nitrogen, into the amorphous silicon. The nitrogen-impregnated amorphous silicon is shown in FIG. 3 as comprising a surface layer 40, by way of illustration only, and without any intent to be bound by such an illustrated structure. It will be understood that the nitrogen may or may not be homogeneously dispersed throughout the amorphous silicon during the initial treatment, the extent of such initial dispersement of the nitrogen not being deemed to be crucial to the function of the nitrogen within the amorphous silicon as an inhibitor of grain growth and crystal formation. It should also be noted that while this treatment may result in the formation of minor amounts of silicon nitride ($Si_3N_4$) in the amorphous silicon, such formation is not believed to be the principal mechanism by which the grain growth and crystal formation of the silicon is inhibited, particularly in view of the large amount of nitrogen which would be needed to provide the necessary stoichiometry required for the formation of silicon nitride from the amorphous silicon, if the formation of silicon nitride was mandatory.

Figure 4:
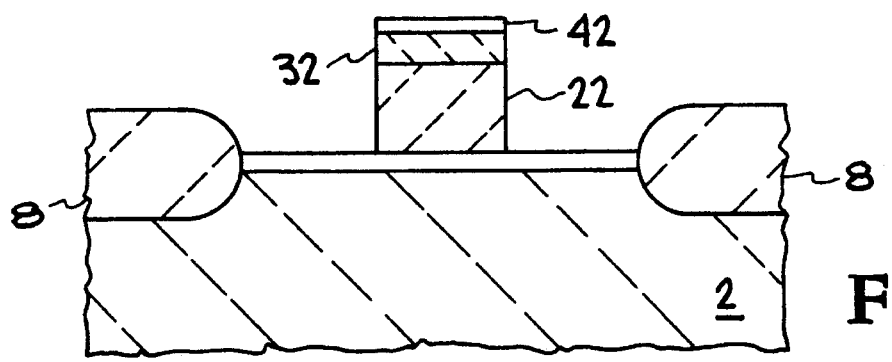
FIG. 4 is a fragmentary vertical cross-sectional view showing the patterning of both the amorphous silicon layer and the underlying polysilicon layer, in accordance with the invention.

After treatment of amorphous silicon layer 30 with the grain growth and crystal formation-inhibiting material, both treated amorphous silicon layer 30 and underlying polysilicon layer 20 are patterned (masked and etched) to form polysilicon gate electrode 22 having amorphous silicon cap 32 and 42 thereon, with numeral 42 depicting the nitrogen-treated amorphous silicon, it being understood, as discussed above, that portions 32 and 42 may comprise a single homogeneous nitrogen-treated amorphous silicon portion. Since silicon cap 32/42 also comprises silicon, as well as polysilicon gate electrode 22, any conventional means for patterning a polysilicon layer to form a polysilicon gate electrode may be utilized for this step, resulting in the structure shown in FIG. 4.

The structure may then be implanted, if desired, to form LDD regions in the substrate adjacent the channel region beneath the gate electrode, followed by the conventional formation of oxide shoulders or spacers adjacent the gate electrode and over the LDD regions prior to the formation of the source/drain regions in the substrate. Optionally, an anneal may be carried out at this time to drive in the LDD dopant and to repair the substrate damage caused by the LDD implant.

Figure 5:
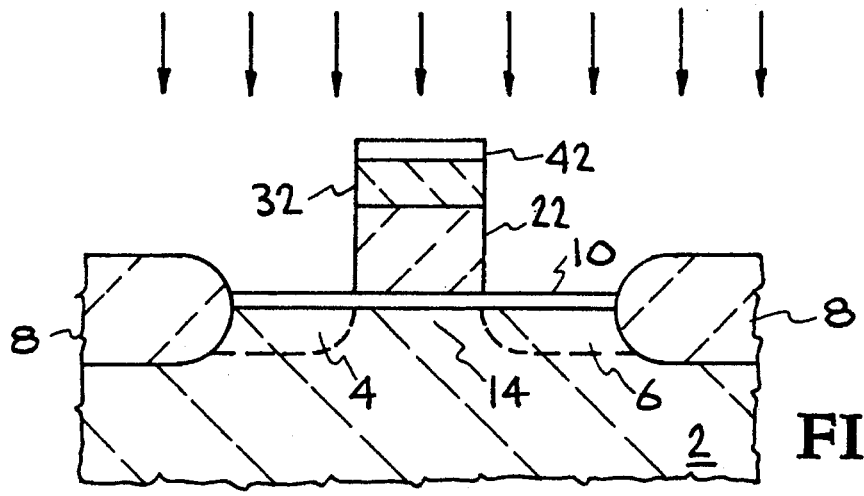
FIG. 5 is a fragmentary vertical cross-sectional view showing the structure being implanted to form the source and drain regions with the patterned amorphous silicon shown over the underlying patterned polysilicon gate electrode inhibiting the channeling through the polysilicon gate electrode of the ions being implanted, in accordance with the invention.
Figure 6:
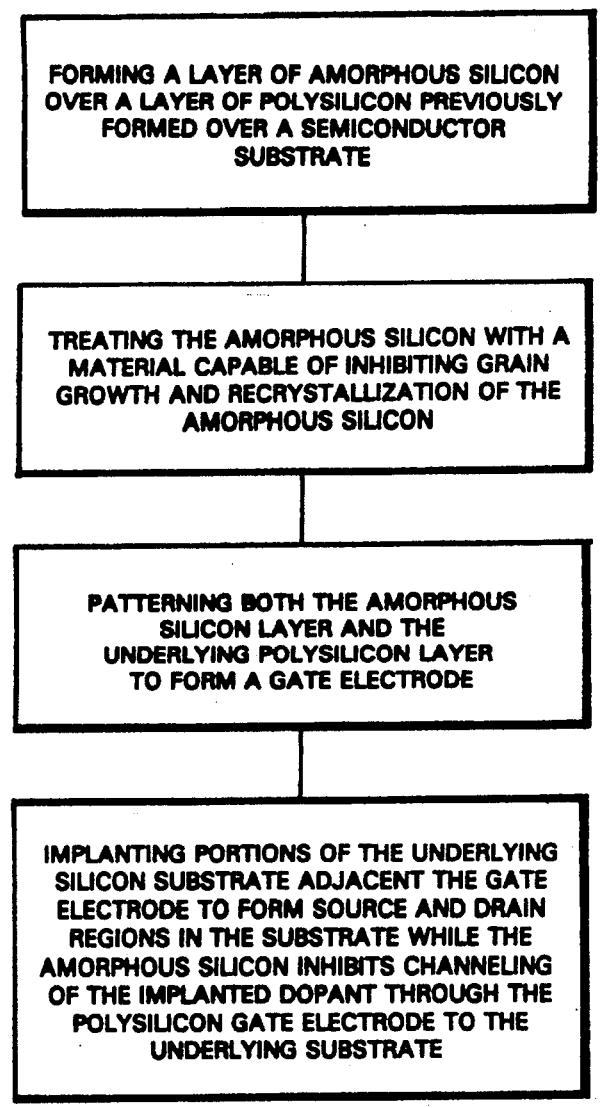
FIG. 6 is a flow sheet illustrating the process of the invention.

In accordance with the invention, substrate 2 is then implanted with a dopant, through thin oxide layer 10, as shown in FIG. 5, to form source/drain regions 4 and 6 without, however, also implanting channel region 14 beneath polysilicon gate electrode 22, due to the presence of treated amorphous silicon 32/42 over polysilicon gate electrode 22. The result is an MOS structure which will exhibit a stable threshold voltage, indicating that the implanted source/drain dopant has not penetrated into the channel region of the device.

After the source/drain implantation step shown in FIG. 5, it is no longer necessary to preserve the amorphous (non-crystalline) state of silicon 32/42. Therefore, the subsequent anneal, carried out at a temperature of, for example, from 750° C. up to as high as 1000° C., which is used to drive the implanted source/drain dopant into substrate 2, as well as to repair the substrate damage caused by the source/drain implantation, may also be used, if desired, to convert the treated amorphous silicon into polysilicon. Such converted polysilicon will, in essence, merge with underlying polysilicon gate electrode 22 to form a single, generally homogeneous, polysilicon electrode, with the minor amount of nitrogen in the silicon being of no adverse consequence.

To further illustrate the invention, a 0.1 μm (1000 Angstrom) thick amorphous layer of silicon may be formed by CVD at a temperature of about 500° C. over a previously formed polysilicon layer which was formed over a thin oxide layer on a silicon semiconductor wafer. The polysilicon layer may have already been optionally doped with a dopant such as $POCl_3$ to increase the conductivity of the polysilicon. After deposition of the amorphous silicon layer over the wafer, the amorphous layer may be treated in a closed chamber by flowing ammonia ($NH_3$) into the chamber while maintaining the wafer at a temperature of about 600° C. for about 30 minutes. If the polysilicon layer has not already been doped to increase its conductivity, the polysilicon may now be doped by an implantation through the overlying amorphous silicon layer.

The polysilicon layer, and treated amorphous silicon layer thereon, may then be conventionally patterned to form a silicon gate electrode. If desired, lightly doped drain (LDD) regions in the substrate adjacent the channel region beneath the gate electrode, may now be optionally formed by appropriate conventional implantation of the substrate followed by the formation of oxide shoulders adjacent the polysilicon gate electrode and over the doped regions in the substrate which will form the LDD regions. The structure may now be optionally annealed to drive in the LDD dopants and to repair the substrate damage caused by the LDD implantation.

The substrate may now be conventionally implanted, e.g., with boron, phosphorus, or arsenic, to form the desired source/drain regions in those portions of the substrate adjacent the silicon gate electrode. The amorphous (non-crystalline) nature of the amorphous silicon over the polysilicon portion of the gate electrode prevents or inhibits the implanted dopant, which strikes or impacts the amorphous silicon, from passing through the amorphous silicon and thorough the polysilicon into the silicon substrate through a channeling mechanism, since the amorphous silicon structure over the polysilicon gate electrode provides no such channels for such passage of dopant atoms therethrough, as may the underlying polysilicon.

The resulting MOS structure subsequently formed will exhibit a stable threshold voltage, characteristic of a structure having no source/drain dopant in the channel portion of the substrate below the gate electrode.

Having thus described the invention what is claimed is:

1. A process for forming MOS devices in integrated circuit structures on a semiconductor substrate while inhibiting channeling of dopant through the gate electrode into said semiconductor substrate during implantation of said substrate to form source and drain regions therein which comprises:

a) forming a layer of amorphous silicon over a layer of polysilicon previously formed over said semiconductor substrate;

b) treating said amorphous layer of silicon with a material capable of inhibiting grain growth and recrystallization of said amorphous silicon;

c) patterning both said amorphous silicon layer and said polysilicon layer to form a gate electrode; and d) implanting portions of said semiconductor substrate adjacent said gate electrode to form source and drain regions in said substrate;

whereby the presence of said amorphous silicon over said polysilicon gate electrode inhibits channeling of said dopant through said polysilicon gate electrode during said implantation of said substrate to form said source and drain regions therein.

2. The process of claim 1 wherein said step of treating said amorphous layer of silicon with a material capable of inhibiting grain growth and recrystallization of said amorphous silicon further comprises treating said amorphous layer of silicon with a nitrogen-containing material.

3. The process of claim 1 wherein said step of treating said amorphous layer of silicon with a material capable of inhibiting grain growth and recrystallization of said amorphous silicon further comprises treating said amorphous layer of silicon with a nitrogen-containing material selected from the group consisting of $N_2$, $NH_3$, $NH_4OH$, $N_2H_4$, and $N_2H_2(OH)_2$.

4. The process of claim 1 wherein said step of treating said amorphous layer of silicon with a material capable of inhibiting grain growth and recrystallization of said amorphous silicon further comprises treating said amorphous layer of silicon with NH$_3$.

5. The process of claim 1 wherein said step of treating said amorphous layer of silicon with a material capable of inhibiting grain growth and recrystallization of said amorphous silicon further comprises treating said amorphous layer of silicon by implanting it with a nitrogen-containing material.

6. A process for forming MOS devices in integrated circuit structures on a semiconductor substrate while inhibiting channeling of dopant through the gate electrode into said semiconductor substrate during implantation of said substrate to form source and drain regions therein which comprises:

a) forming a layer of amorphous silicon over a layer of polysilicon previously formed over said semiconductor substrate;

b) treating said amorphous layer of silicon with a nitrogen-containing material capable of inhibiting grain growth and recrystallization of said amorphous silicon;

c) patterning both said amorphous silicon layer and said polysilicon layer to form a gate electrode; and d) implanting portions of said semiconductor substrate adjacent said gate electrode to form source and drain regions in said substrate;

whereby the presence of said amorphous silicon over said polysilicon gate electrode inhibits channeling of said dopant through said polysilicon gate electrode during said implantation of said substrate to form said source and drain regions therein.

7. The process of claim 6 wherein said step of forming said amorphous silicon layer over said polysilicon layer further comprises forming said amorphous silicon layer at a temperature not exceeding about 550° C. to avoid crystallizing portions of said amorphous silicon layer during said formation.

8. The process of claim 6 wherein said step of treating said amorphous silicon layer with said nitrogen-containing material further comprises treating said amorphous silicon layer until at least about 2 wt. % of said treated amorphous silicon layer consists of nitrogen.

9. The process of claim 6 wherein said step of treating said amorphous silicon layer with said nitrogen-containing material further comprises treating said amorphous silicon layer until from about 2 wt. % to about 10 wt. % of said treated amorphous silicon layer consists of nitrogen.

10. The process of claim 6 wherein said step of treating said amorphous silicon layer with said nitrogen-containing material further comprises treating said amorphous silicon layer at a temperature sufficiently low to inhibit recrystallization of said amorphous silicon during said treatment.

11. The process of claim 6 wherein said step of treating said amorphous layer of silicon with said nitrogen-containing material further comprises treating said amorphous layer of silicon with a nitrogen-containing material selected from the group consisting of N$_2$, NH$_3$, NH$_4$OH, N$_2$H$_4$, and N$_2$H$_2$(OH)$_2$.

12. A process for forming MOS devices in integrated circuit structures on a semiconductor substrate while inhibiting channeling of dopant through the gate electrode into said semiconductor substrate during implantation of said substrate to form source and drain regions therein which comprises:

a) forming a layer of amorphous silicon over a layer of polysilicon previously formed over said semiconductor substrate at a temperature sufficiently low to inhibit recrystallization of said amorphous silicon on said polysilicon layer;

b) treating said amorphous layer of silicon with ammonia at a temperature insufficient to recrystallize said amorphous silicon until said amorphous silicon contains at least about 2 wt. % of nitrogen to thereby inhibit grain growth and recrystallization of said amorphous silicon;

c) patterning both said amorphous silicon layer and said polysilicon layer to form a gate electrode; and d) implanting portions of said semiconductor substrate adjacent said gate electrode to form source and drain regions in said substrate;

whereby the presence of said amorphous silicon over said polysilicon gate electrode inhibits channeling of said dopant through said polysilicon gate electrode during said implantation of said substrate to form said source and drain regions therein.

13. The process of claim 12 including the further step of converting said amorphous silicon into crystalline silicon after said step of implanting said substrate to form said source and drain regions.

\* \* \* \* \*